United States Patent [19]
Dändliker et al.

[11] Patent Number: 6,005,666
[45] Date of Patent: *Dec. 21, 1999

[54] APPARATUS FOR AND METHOD OF OPTICAL INSPECTION IN TOTAL INTERNAL REFLECTION HOLOGRAPHIC IMAGING SYSTEM

[75] Inventors: Rene Dändliker, Corcelles; John Edward Brook, Ligniéres, both of Switzerland; Massoud Hamidi, Vanves, France

[73] Assignee: Holtronic Technologies, Limited, London, United Kingdom

[ * ] Notice: This patent is subject to a terminal disclaimer.

[21] Appl. No.: 07/588,945

[22] Filed: Sep. 26, 1990

[30] Foreign Application Priority Data

Oct. 4, 1989 [GB] United Kingdom ............ 8922341

[51] Int. Cl.$^6$ .................................. G01B 11/02
[52] U.S. Cl. .................. 356/355; 356/357; 356/382; 356/348; 356/356; 359/10; 359/12; 250/201.2
[58] Field of Search .................. 356/355, 357, 356/348, 382, 400, 356, 358, 347; 359/10, 12, 27, 30, 24, 32, 34; 250/201.2

[56] References Cited

U.S. PATENT DOCUMENTS 4,857,425  8/1989  Phillips ................................ 359/30
4,966,428  10/1990  Phillips ................................ 359/9

Primary Examiner—Samuel A. Turner
Assistant Examiner—La Charles P. Keesee
Attorney, Agent, or Firm—Stanger, Stempler & Dreyfus, P.C.

[57] ABSTRACT

Apparatus for and a method of optical inspection in a total internal reflection holographic imaging system. Multi wavelength laser beams are directed onto a prism supporting a first substrate containing pre-recorded hologram which is to be imaged onto a recording medium of a second substrate, the multi wavelength beams being normal to both substrates. The distance between the two substrates is measured by interferometric techniques. Actuators are provided for adjusting the distance between the two substrates, these actuators being energized to cause minute adjustments of the spacing during a scanning operation whereby the imaging of the pre-recorded hologram is ensured at the correct focus throughout the scanning operation.

20 Claims, 4 Drawing Sheets

APPARATUS FOR AND METHOD OF OPTICAL INSPECTION IN TOTAL INTERNAL REFLECTION HOLOGRAPHIC IMAGING SYSTEM

FIELD OF THE INVENTION

The present invention relates to an apparatus for and a method of optical inspection in a total internal reflection holographic imaging system.

It relates generally to an apparatus for and a method of inspection for detecting the focal point necessary to obtain holographic or photolithographic reproduction and also additionally to an apparatus for and a method of adjusting the focal distance so as to maintain a correct focus during the reconstruction of the hologram on a recording medium.

DESCRIPTION OF PRIOR ART

Total internal reflection (T.I.R.) holograms are holograms which are made with either one or both of the object and reference beams totally internally reflected from the air/hologram interface. An article by K. A. Stetson, in Applied Physics Letters (June 1968), describes a method of T.I.R. holographic imaging. A holographic layer is index matched onto the hypotenuse surface of a right-angled prism to enable the reference beam to arrive at the hologram surface at greater than the critical angle $\Theta c$. The object beam arrives through a semi-transparent object which is placed in close proximity above the hologram. The conjugate reconstruction beam produces the holographic image in the same plane as the original object.

However, if a photosensitive material and its supporting substrate is placed in close proximity to capture the holographic image spatial access to the recording medium and the image is prevented due to the substrate and the prism. This hinders a standard inspection system being employed that could ensure good registration between the holographic image and the recording medium.

U.S. Pat. Specification No. 4,857,425, which is based on the above principle described by Stetson disclosed a specific application, namely a method of manufacturing an integrated circuit by means of the following basic steps:

(a) providing a first recording medium which exhibits negligible scatter and high resolution without shrinking or distorting;

(b) forming a volumetric holographic image of the circuit pattern on the first recording medium by interference between an input beam of coherent light passing through a mask containing the integrated circuit, and a reference beam of coherent light which is totally internally reflected at the surface on which the recording medium is located;

(c) replacing the mask by a silicon wafer having a second recording medium in order to reproduce the holographic image of the integrated circuit;

(d) forming the image of the hologram on the second recording medium by illuminating the hologram with a second reference beam which travels in the reverse direction from the first reference beam which formed the hologram, and (e) repeating the replaying operation a plurality of times with a plurality of silicon wafers.

In a development of the above method, the problem resulting from non-uniformity of the replay beam has been solved using a scanning technique as disclosed in our copending U.S. Pat. application Ser. No. 306,638. The system proposed in this application involves using a restricted or narrow reference beam which scans the holographic image on the first recording medium in order to build-up an integrated circuit on the second recording medium provided on its silicon wafer.

One problem encountered as a result of the improvement disclosed in the above numbered copending Application is that because it is now possible to use a larger silicon wafer, problems arise in ensuring that all portions of the replayed image on the second recording medium provided on a silicon wafer are exactly in focus. Minute variations in distance on the replay of the holographic image may mean that some areas are not perfectly in focus.

It is, therefore, an object of the present invention to provide a way of optically inspecting the relative position between the hologram and the recording medium irrespective of the specificity of the application such as a) Integrated circuits, b) Optical memory discs, c) High definition screens (such as HDTV), d) Surface acoustic wave devices, (e) Photomask reticles whilst permitting the necessary prism geometry to reconstruct the total internally reflected hologram.

SUMMARY OF THE INVENTION

According to a first aspect of the present invention there is provided a method of optical inspection in a total internal reflection holographic imaging system, including the steps of: directing a light beam (or inspection beam) into a prism and onto the surface of the hologram pre-recorded on a first recording medium at substantially normal incidence. The light beam is partially reflected at the hologram/air interface. The transmitted portion should arrive substantially at normal incidence and be reflected by the second recording medium and substrate. The two normally reflected beams will interfere with each other. These interfered beams will then be analysed by interferometric or diffractive techniques to obtain a signal corresponding to the distance between the reflecting surfaces. Preferably the said method is used for detecting focus.

To employ this technique in T.I.R. holographic printing the geometry of the optical prism must be such that it permits access of the inspection beam at or near normal incidence whilst allowing the holographic reconstruction beam (R) to arrive at an angle greater than the critical angle $(\Theta c)$.

Two examples of geometries which respect these conditions are shown in FIG. 1 and FIG. 2: The method may additionally include the step of varying the distance between the two recording mediums in response to said measurement so as to maintain the correct focus at all points.

This focusing of the second recording medium into the holographic image created by the first recording medium can be done in a number of ways as follows:

(a) A plurality of optical inspections of the second substrate can be made at different locations thereof in order to build up a digitized plan of the topography of the second substrate, it being preferred to store such plan in the memory of a computer. This plan would then guide the actual lithography process during the replay operation.

(b) In the case where the hologram of the first recording medium is scanned in order to build-up the holographic image on the second recording medium, for each area of the hologram being recorded, the steps of determining the focus and maintaining the correct focus are carried out simultaneously with step of recording the holographic image onto the second recording medium of the silicon substrate.

(c) A combination of the two above described ways in form of a step and scan operation in which one could obtain a digitized plan of the topography of part of the second recording medium, determine the correct focus for that part of the recording medium, record part of the holographic image onto the second recording medium of the silicon substrate, and repeat the above process for another part of the second recording medium.

According to a second aspect of the present invention there is provided apparatus for optical inspection in a total internal reflection holographic imaging system including: a light beam which is directed into a prism and onto the surface of the hologram pre-recorded on a first recording medium at substantially normal incidence. The light beam is partially reflected at the hologram/air interface. The transmitted portion will arrive at and will be reflected by the second recording medium and substrate. The two reflected beams will interfere with each other and will return along the incidence path. These interfered beams will then be analysed by interferometric or diffractive techniques to obtain a signal corresponding to the distance between the reflecting surfaces.

Preferably, said apparatus for optical inspection is used to detect focus.

Means may be provided for adjusting the distance between the two recording mediums in response to the measurement obtained, so as to maintain the correct focus at all points. Preferably said distance adjusting means includes a plurality of actuators such as piezo-electric drivers or stepping motors. Preferably three such actuators are used.

BRIEF DESCRIPTION OF THE DRAWINGS

The present invention will now be described in greater detail by way of example with reference to the accompanying drawings, wherein.

BRIEF EXPLANATION OF BASIC PRINCIPLE

Figure 1:
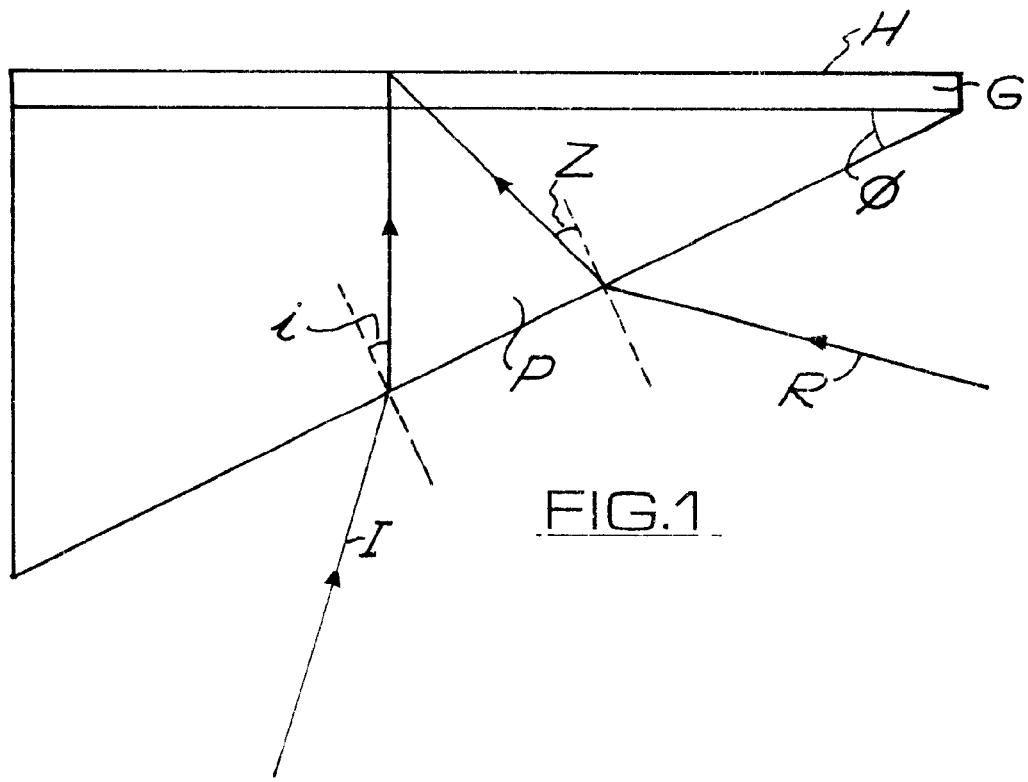
FIGS. 1 and 2 are diagrammatic representations to explain the principle on which the present invention is based.
Figure 2:
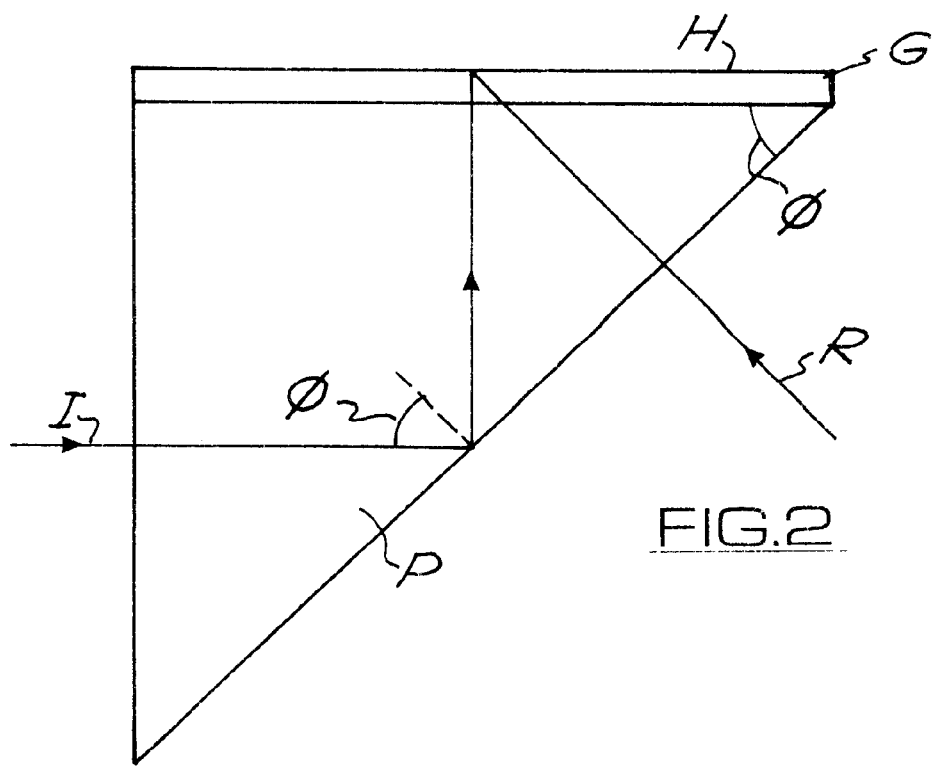

To appreciate the principle on which the present invention is based reference should first of all be made to the two examples of prism geometry show in FIGS. 1 and 2. In these diagrams a hologram H is formed on a recording emulsion coated on the upper surface of a glass plate G. The lower surface of the glass slab is in contact with the upper surface of a prism P. The refractive indices of the glass slab and the prism are the same. A reconstruction beam, described as the replay beam in U.S. Pat. Specification No. 4,857,425 is denoted by R, and an inspection beam for determining the correct focus is denoted by I.

In addition the following symbols are defined as follows:
Θc=the critical angle
Θr=the angle of the reconstruction or replay beam to the hologram ø=prism angle
z=internal angle of the reconstruction beam to prism surface
i=internal angle of the inspection beam to the prism surface The proposed method of inspection involves directing a light beam I through the prism P at or near normal incidence at the hologram surface. The partial reflection from the hologram/air interface and the reflection from the recording medium surface will be superimposed and will form an interferometer. Using standard documented techniques, the intensity of the aforementioned interferometer can be used to obtain an absolute value for the distance between the hologram surface and the recording media.

To employ this technique in T.I.R. holographic printing the geometry of the optical prism must be such that it permits access of the inspecting beam I at or near normal incidence whilst allowing the holographic reconstruction beam R to arrive at an angle greater than the critical angle Θc.

For the prism geometry shown in FIG. 1, the condition for the inspection beam I to be able to arrive at normal incidence to the hologram surface is $$ø<Θc$$

The condition for the reconstruction beam to be able to arrive at the hologram surface at greater than the critical angle is $$ø>Θr−Θc$$

Another acceptable prism geometry is the one illustrated in FIG. 2. In this example ø is greater than the critical angle Θc permitting the reconstruction beam R to arrive at the hologram surface at greater than the critical angle Θc. The inspection beam I enters the prism P by the face perpendicular to the hologram surface but arrives normally after a total internal reflection at the hypotenuse surface of the prism P.

DESCRIPTION OF THE PREFERRED EMBODIMENT

The application of the above principle to detecting the correct focus in the replay operation where a replayed image of a hologram is formed or built-up in sections on the recording medium of a silicon wafer will now be described in greater detail with reference to FIGS. 3 and 4.

Figure 3:
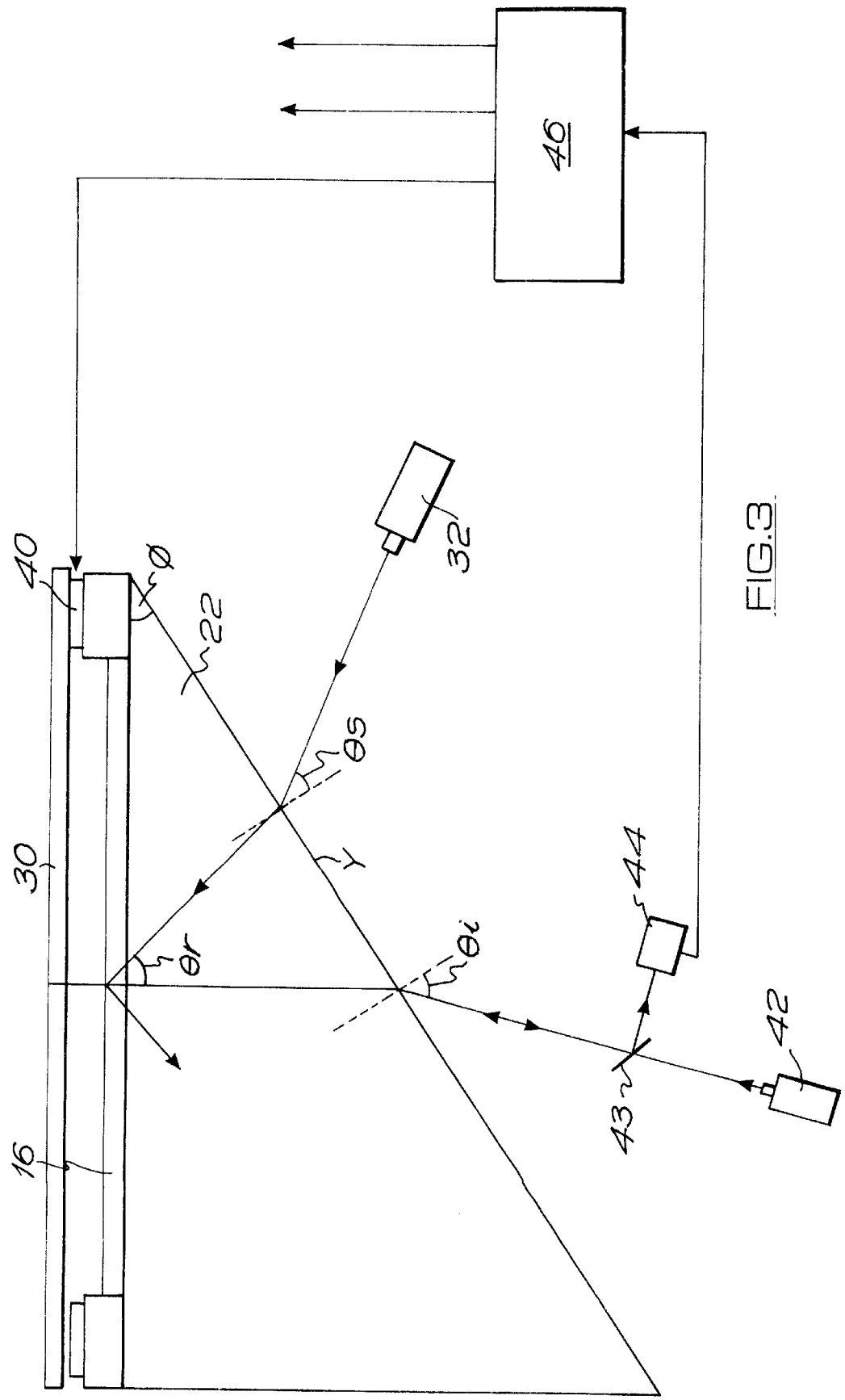
FIG. 3 is a diagrammatic representation of one preferred embodiment of optically inspecting the relative position between the hologram and the recording medium during the replay operation.

Referring to FIG. 3, instead of utilizing the shape of prism disclosed in prior U.S. Pat. Specification No. 4,857,425, a right angled prism 22 is used instead. This has angles of 30°, 60° and 90°, the prism angle being equal to 300°. A T.I.R. hologram is pre-recorded on a first recording medium provided on the upper surface of a glass plate 16, the glass plate being index matched to the prism. For a refractive index of n=1.5, the critical angle Θc is 41.80. The reconstruction or replay beam is provided by a laser source 32, the angle Θs of the replay beam to the prism surface Y is required to be 22.8. A silicon wafer 30 is mounted above the surface of the first recording medium provided on the upper surface of the glass and its position determined by actuators 40.

Figure 4:
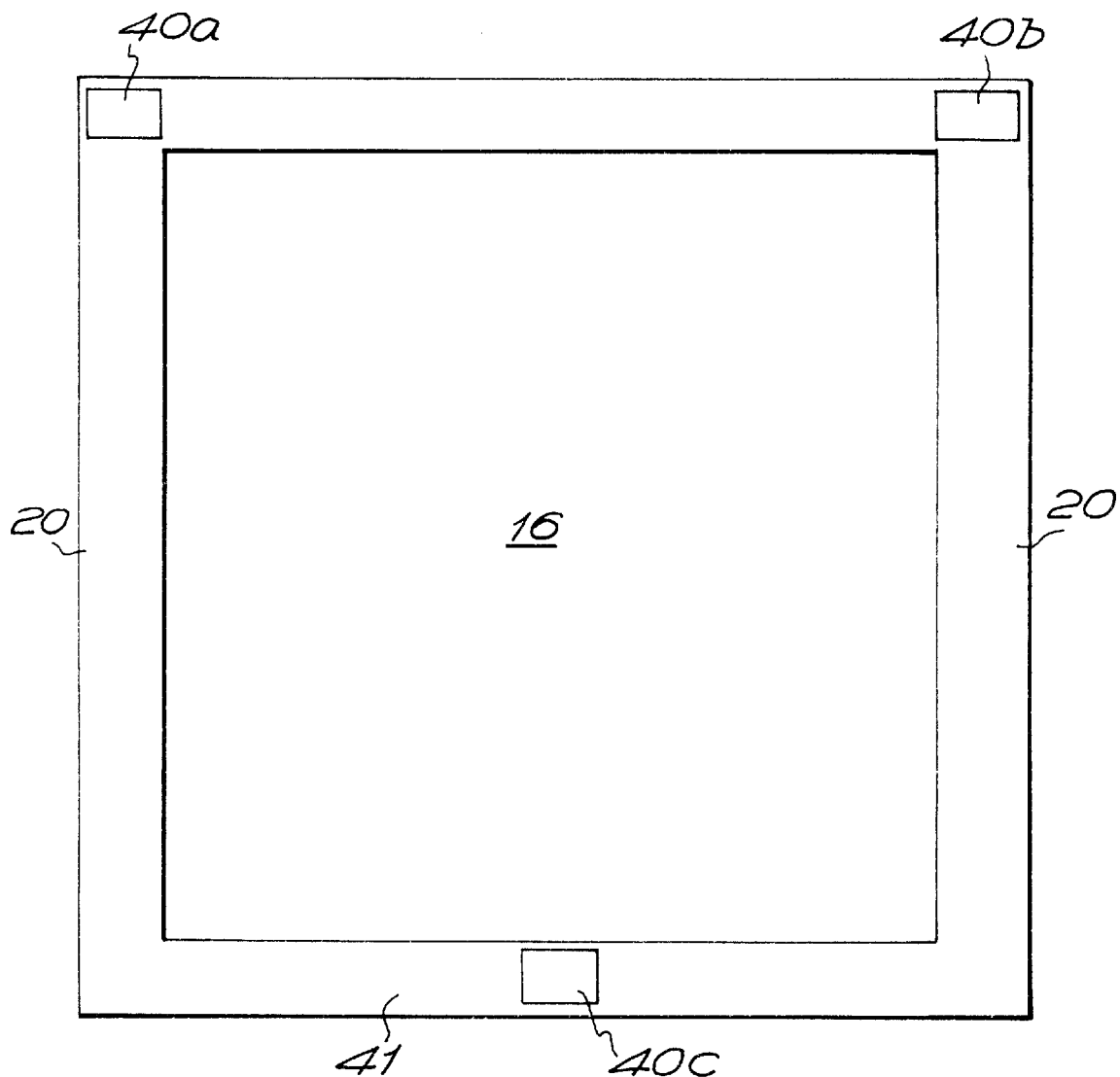
FIG. 4 is a plan view of the glass plate showing the positioning of the actuators which separates the silicon slice from the glass plate.

Referring now to FIG. 4, three actuators 40a, 40b and 40c are provided between the glass plate 16 and the silicon wafer 30 these being mounted on suitable supports 50. As shown the actuators 40a and 40b are arranged at two corners, whilst the third actuator 40c is arranged midway along the bottom edge 41. Preferably, the actuator are piezo-electric spacers and the thickness of each of the three piezo-electric spacers 40 can be independently varied by the application of applied voltages, the amount of expansion of each piezo-electric spacer 40 being approximately linear with the magnitude of the voltage applied thereto.

Referring back again to FIG. 3, the distance between the underneath surface of the silicon wafer 30 and the upper surface of the holographic material laying on the surface of the glass plate 16 can be checked, and adjusted if appropriate, before that section of the image is transferred to the second recording medium on the silicon wafer. For this purpose there is provided a light beam 42—the nature of which would be discussed later—which is moved in synchronisation with the movement of replay laser source 32 which scans the volumetric holographic image on the first recording medium. The light beam is fed into the surface Y of the prism 22 at an angle $\Theta i$ of 48.6° and passes through the glass plate perpendicular to the faces thereof. At the hologram surface, which is on the upper surface of the glass plate 16, the light beam will be partially reflected due to the difference in refractive index between the holographic material and air. Part of the transmitted portion of the light will be reflected by the mirror-like wafer surface.

As the light arrives normally to the above mentioned reflecting surfaces the two reflected beams are thus superimposed and will return along the incidence path. At a beam splitter 43 a percentage of the returning light will be reflected towards a detector system 44. If the coherence length of the light source 42 is greater than two times the distance between the wafer and the hologram, the two superimposed reflected beams would interfere and the intensity of the detected beam is then given by:

$$I = I_W + I_H + 2\sqrt{I_W I_H} \cos\left(\frac{4\pi d}{\lambda}\right) \quad (1)$$

where:
d is distance between the wafer and the hologram, $\lambda$ is the wavelength.

$I_W$ and $I_H$ are respective intensities of the two reflected beams.

Therefore, for a given wavelength the measured intensity I will give the information required for focusing. However, as equation (1) has a cosine form, the parameter d will only be unambiguous over a distance of $\lambda_2$ which for a HeNe laser operating at 632.8 nm gives a value of 316.4 nm.

The exact nature of the light source 42 and the way the returning beam can be analysed by the detection system 44 will now be described in greater detail by way of examples:

In the first example the light source is a double wavelength laser provided by a combination of two single-wavelength laser beams or by a multiline laser. The use of a second wavelength laser source is to extend the unambiguous operating distance to one which is more practical for T.I.R. holographic printing applications. The unambiguous distance is extended to $\Lambda/2$ where $\Lambda$ is given by $$\Lambda = \lambda_1 \lambda_2 / (\lambda_1 - \lambda_2) \quad (2)$$

where $\lambda_1$ and $\lambda_2$ are the two wavelengths of the combined beam.

Using the 632.8 nm and 611.8 nm lines of the HeNe laser, for example, gives an unambiguous operating distance of 9.22 $\mu$m. This unambiguous distance can be extended to 83.74 $\mu$m by using 632.8 nm and 635.2 nm lines of a HeNe laser.

In order that accurate interpretation of the distance between the hologram and the wafer is achieved it is preferable that the signals corresponding to each wavelength are read separately. This is possible by alternatively switching on and off the two laser sources or by using a wavelength sensitive beam-splitter to separate the two interferrograms onto two separate detectors in the detector system 44. The output of the detector system 44 is applied to a microprocessor 46.

Well documented standard techniques are available for accurate interpretation of the detected signals. In this respect reference is directed to K. Creath—Phase—Measurement Interferometry Techniques, ed. E. Wolf, Progress in Optics XXVI Elalvier (1988).

In order to combine wide unambiguous operating distance and very accurate measurements, more than two wavelengths can be used.

In the second example considered hereafter, the light source 42 has a continuous broad band wavelength spectrum, such as light provided by incandescence lamps or Xenon lamps or equivalent sources. However, in order not to expose the second recording medium coated on top of the wafer 30, the spectrum of the source is cleaned, if necessary, of wavelengths to which the mentioned recording medium is sensitive. That could be achieved preferably by means of an appropriate optical filter.

Due to the short coherence length (less than a few microns) of the light the two reflected beams $b_W$ (reflected on the air-wafer separation) and $b_H$ (reflected on the air-hologram separation) do not interfere coherently before arriving to the detector system 40. To extract valuable information out of the returning beam a standard technique commonly known as "white light interferometry" and Channelled Spectra (reference P. Hariharan, Optical Interferometry, Academic Press 1985) are used, which will be described hereafter by way of a practical example and with reference to the attached drawings.

Figure 5:
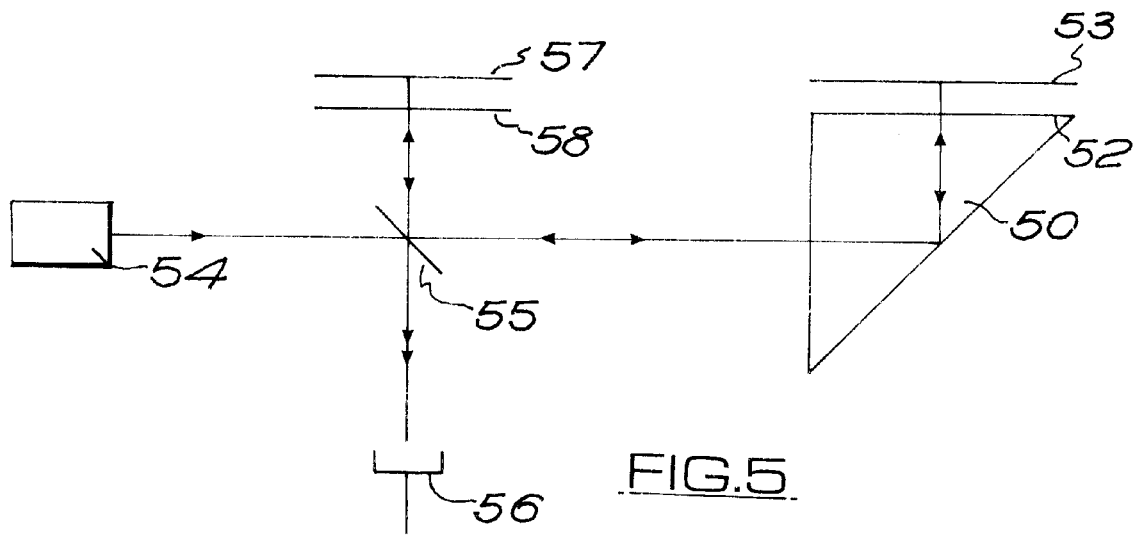
FIG. 5 and FIG. 6 are schematic representations of two examples of detector systems that may preferably be used with the present invention.

Reference is now made to FIG. 5 which shows a preferred arrangement for the white light method referred to above. The equipment includes a prism 50, hologram 52 on one face thereof, wafer 53, white light source 54, beam splitter 55, detector 56 and two reflecting surfaces 57 and 58.

In this case the white light from the source 54 after reflection from the surface of the wafer 53 is made to pass through another arm of the interferometer by means of the beam splitter 55. This other arm of the interferometer contains the two reflecting surfaces 57 and 58 which together define a reference distance. When the path length between the said reflecting surfaces 57 and 58 is equal to the path length between the wafer 53 and hologram 52 then the path length difference for each wavelength is zero resulting in a white fringe. Therefore by setting the distance between the said reflecting surfaces 57 and 58 to be the preferred operating distance between the wafer 53 and hologram 52 correct focus can be achieved by locking onto the aforementioned white fringe.

Figure 6:
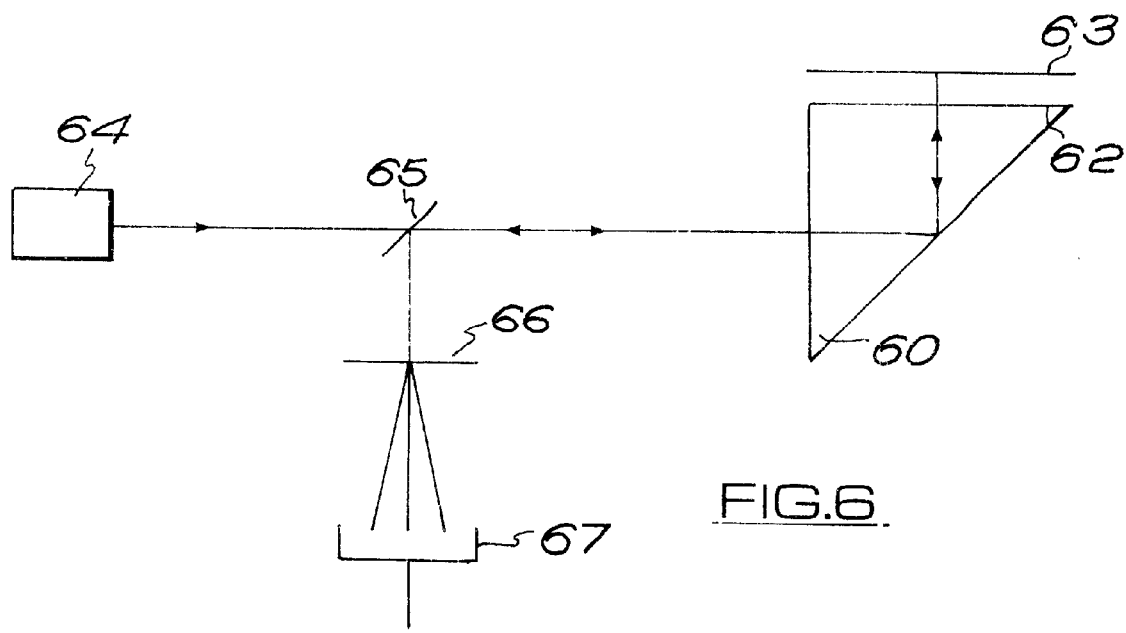

Reference is now made to FIG. 6 which shows a preferred arrangement for the channelled spectra method referred to above. The equipment includes a prism 60, hologram 62 on one face thereof, wafer 63, light source 64, beam splitter 65, diffraction grating 66 and detector array 67.

In the channelled spectra case the interference of each wavelength in the returning beam can be analyzed by passing the said beam through the diffraction grating 66. The spectra thus produced will show dark bands, the detecting and separation of which by the detector array 67 gives the necessary information to calculate the separation, between the wafer 63 and the hologram 62.

In the preferred examples described, not only is the distance between the silicon slice containing a second recording medium and the hologram on the glass plate measured, steps are taken to ensure that the correct distance is maintained during the replay operation particularly in the case where a plurality of overlapping exposures are made during the scanning sequence as disclosed in copending application Ser. No. 306,638.

It will be appreciated that the above described apparatus for and method of optical inspection in a total internal reflection holographic imaging system is applicable to all types of photolithographic applications including (a) Integrated circuit imaging, (b) Optical memory discs, (c) High definition screens (including HDTV), (d) Surface acoustic wave devices, (e) Photomask reticles.

Furthermore it is equally applicable in the case where the holographic material is covered by a flat optical substrate in which the substrate/air interface replaces the hologram/air surface as one of the partially reflecting surfaces.

Moreover it will be appreciated that the method can be implemented such that, either, the inspection beam is scanned across the lithographic substrate and measurements are taken continuously or the inspection beam can be moved to a series of discrete positions and measurements only being taken at these points. Furthermore, the measurements on the focus as a function of position can be either taken in synchronization with the reconstruction process or taken beforehand and the information stored in memory.

What we claim is:

1. A method of optical inspection in a total internal reflection holographic imaging system, including the steps of: directing a light beam into a prism supporting a first substrate containing a hologram pre-recorded on a first recording medium to be imaged onto a second recording medium of a second substrate, such that the beam is normal to the first and second substrates; and detecting a measurement of the distance between the first and second recording media by interferometric techniques or diffractive techniques utilizing beams reflected from the two recording mediums.

2. A method according to claim 1, wherein said method of optical inspection is used for detecting focus.

3. A method according to claim 1, including the additional step of varying the distance between the two recording mediums in response to said measurement so as to maintain the correct focus at all points.

4. A method according to claim 3, including the steps of:
making a plurality of optical inspections of the second substrate at different locations thereof to build up a digitized plan of the topography of the second substrate; storing said plan in the memory of a computer; and utilizing the stored information to guide the actual lithography process during the replay operation.

5. A method according to claim 3, including determining the focus and maintaining the correct focus simultaneously with the step of recording the holographic image onto the second recording medium of the silicon substrate.

6. A method according to claim 3, in the form of a step and scan operation which includes the steps of: obtaining a digitized plan of the topography of a part of the second recording medium; determining the correct focus for that part of the recording medium; recording part of the holographic image onto the second recording medium of the silicon substrate; and repeating the above process for another part of the second recording medium.

7. A method according to claim 1, wherein the said light beam is a dual or multi-wavelength laser beam and the distance information is obtained by observing the intensity of the interferometers formed by the reflections of the dual or multi-wavelength laser beam from the two substrates.

8. A method according to claim 1, wherein the said light beam is a substantially collimated white light or broad band source, the reflections of this beam from the first and second substrates interfering with a similarly reflected beam of the same source from two reference substances having the desired separation.

9. A method according to claim 1, wherein the said light beam is a substantially collimated white light or broad band source, the reflections of this light beam from the first and second substrates passing through a diffraction grating, giving a spectrum analysis of the return beam, the distance between the peaks in the spectrum giving the necessary information for calculating the separation of the two substrates.

10. A method of viewing through a prism to obtain information from two target surfaces, one attached to and the other in close proximity to the prism, these surfaces being otherwise inaccessible to measurement due to the Prism Geometry on one side of the surfaces and the opacity of a substrate on the other side, the method including the steps of: directing a light beam into the prism such that the beam is normal to the two target surfaces; and obtaining said information using detection by interferometric techniques or diffractive techniques utilizing beams reflected from the two target surfaces.

11. A method according to claim 10, as applied to prism geometries which allow a holographic reproduction or replay beam at an angle greater than the critical angle and an inspection beam to arrive at or near normal incidence to the two target surfaces.

12. Apparatus for optical inspection in a total internal reflection holographic imaging system including: a light source whose beam is directed into a prism supporting a first substrate containing a hologram pre-recorded on a first recording medium which is to be imaged onto a second recording medium of a second substrate, the light beam being directed normal to the surfaces of the first and second substrates; a detector for detecting the superimposed reflected beams from the two surfaces of the substrates bearing the recording mediums whereby a measurement of the distance therebetween can be obtained by interferometric or diffractive techniques.

13. Apparatus according to claim 12, wherein said apparatus for optical inspection is used to detect focus.

14. Apparatus according to claim 12, wherein said means are provided for adjusting the distance between the two recording mediums in response to the measurement obtained so as to maintain the correct focus at all points.

15. Apparatus according to claim 12, wherein said light source comprises dual or multi-wavelength laser beams, and the superimposed reflected beams from the surfaces of the two substrates are fed to said detector system by means of a beam splitter.

16. Apparatus according to claim 14, wherein said distance adjusting means includes a plurality of actuators to adjusting the distance between the two substrates.

17. Apparatus according to claim 16, wherein said actuator are piezo-electric spacers.

18. Apparatus according to claim 16, wherein three piezo-electric spacers are utilized to form a substantially equilateral triangle between the two substrates.

19. Apparatus according to claim 16, wherein three variable actuators are utilized, and wherein the prism on which the first recording medium is fixed is mounted in a spatial plan which is determined by three points whose height from the plane is adjusted by means of said three variable actuators.

20. A method of in claim 1, further comprising the steps of utilizing the detection of measurement of the distance between the recording media for changing the spacing between said substrates with piezo electric crystals.

* * * * *